United States Patent
Chen et al.

(10) Patent No.: US 7,623,388 B2
(45) Date of Patent: Nov. 24, 2009

(54) METHOD FOR DETECTING ERRONEOUS WORD LINES OF A MEMORY ARRAY AND DEVICE THEREOF

(75) Inventors: Tzu-Hao Chen, Kaohsiung County (TW); Jen-Shou Hsu, Hsinchu (TW); Lien-Sheng Yang, Hsinchu (TW); Yin-Ming Lan, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 94 days.

(21) Appl. No.: 12/116,197

(22) Filed: May 6, 2008

(65) Prior Publication Data

US 2009/0175097 A1    Jul. 9, 2009

(30) Foreign Application Priority Data

Jan. 7, 2008    (TW) ............................... 97100562 A

(51) Int. Cl.
*G11C 11/34* (2006.01)

(52) U.S. Cl. ............................ 365/185.22; 365/189.07; 365/189.14

(58) Field of Classification Search ............ 365/189.07, 365/185.22, 230.06
See application file for complete search history.

(56) References Cited

U.S. PATENT DOCUMENTS 5,602,789 A * 2/1997 Endoh et al. ............ 365/185.03
7,196,946 B2 * 3/2007 Chen et al. .............. 365/189.07

* cited by examiner

*Primary Examiner*—Son Dinh
(74) *Attorney, Agent, or Firm*—Winston Hsu

(57) ABSTRACT

A method detects if a word line of a memory array is broken. The method includes writing a first datum to a memory cell when coupling a corresponding word line to a voltage source, writing a second datum different from the first datum to the memory cell when the coupling between the corresponding word line and the voltage source is decoupled, reading the stored data of the memory cell, and determining if the word line is broken according to the read data, the first datum, and the second datum.

12 Claims, 4 Drawing Sheets

METHOD FOR DETECTING ERRONEOUS WORD LINES OF A MEMORY ARRAY AND DEVICE THEREOF

BACKGROUND OF THE INVENTION

1. Field of the Invention

The present invention relates to a method and device thereof for detecting broken word lines in a memory array, and more particularly, to a method and device thereof for detecting broken word lines in a Dynamic Random Access Memory (DRAM) array.

2. Description of the Prior Art

Please refer to FIG. 1. FIG. 1 is a diagram illustrating a DRAM array 100. As shown in FIG. 1, the DRAM array 100 comprises word lines $WL_1$, $WL_2$, and $WL_3$, bit lines $BL_1$, $BL_2$, and $BL_3$, switches $SW_{11}$, $SW_{12}$, $SW_{21}$, $SW_{22}$, $SW_{31}$, and $SW_{32}$, and memory cells $M_{11}$, $M_{12}$, $M_{21}$, $M_{22}$, $M_{31}$, and $M_{32}$. When a user writes a datum to a memory cell, the voltage on the corresponding word line is raised to a high voltage $V_H$ for turning on the switch corresponding to the memory cell. For example, when the user writes a datum "1" to the memory cell $M_{22}$, the voltage on the word line $WL_2$ is raised to the voltage $V_H$ so as to turn on the switch $SW_{22}$, which allows the connection between the memory cell $M_{22}$ and the bit line $BL_2$, and consequently the datum "1" is written to the memory cell $M_{22}$. When no data is written to a memory cell, the voltage on the corresponding word line remains at a low voltage $V_L$ for turning off the switch corresponding to the memory cell. As shown in FIG. 1, when a user writes a datum to the memory cell $M_{22}$, only the voltage on the word line $WL_2$ is raised to the high voltage $V_H$, which only turns on the switches $SW_{21}$ and $SW_{22}$, while the word lines $WL_1$ and $WL_3$ corresponding to the remaining memory cells not accessed stays at the low voltage $V_L$.

During the fabrication process of a DRAM, particle impurities exist. The particles result in adjacent word lines being short-circuited so that when the word line is charged for writing data to the corresponding memory cell, the voltage on the charged word line cannot reach to the predetermined voltage $V_H$ since the charge on the charged word line is dispersed over the other word lines short-circuited to the charged word line. As shown in FIG. 1, the particle P exists between the word lines $WL_1$ and $WL_2$, causing a short circuit between the word lines $WL_1$ and $WL_2$. Thus, when a user writes data to the memory cells corresponding to the word lines $WL_1$ or $WL_2$, the short circuit caused by the particle P fails the writing action and the data cannot be written correctly into the memory cells corresponding to the word lines $WL_1$ or $WL_2$. For example, when a user writes a datum to the memory cell $M_{22}$, the voltage on the word line $WL_2$ should be raised to the high voltage $V_H$ and remain at the high voltage $V_H$ throughout the entire writing action, but because of the short circuit between the word lines $WL_1$ and $WL_2$ caused by the particle P, which allows current leakage to flow from the word line $WL_2$ to the word line $WL_1$, the voltage on the word line $WL_2$ cannot stay at the high voltage $V_H$ throughout the entire writing action, and instead gradually falls from the high voltage $V_H$.

Please refer to FIG. 2. FIG. 2 is a diagram illustrating the voltage on the word line $WL_2$. As shown in FIG. 2, in an ideal situation (the particle P does not exist), the voltage on the word line $WL_2$ is raised to the high voltage $V_H$ for a period of time $T_1$ (as shown by the dashed line). In fact, the voltage on the word line $WL_2$ is gradually lowered by the word line $WL_1$ since the voltage on the word line $WL_1$ is at the low voltage $V_L$ at the same time because of the effect of the particle P. When the voltage on the word line $WL_2$ drops to the threshold voltage $V_E$, if the writing action is not finished, the switch $SW_{22}$ is turned off and the data cannot be written to the memory cell $M_{22}$, thus the writing action fails. As shown in FIG. 2, when the word line $WL_2$ is activated (raised to the high voltage $V_H$), if the writing action is not finished by the period $T_2$, the voltage on the word line $WL_2$ drops below the threshold voltage $V_E$, which turns off the switches $SW_{21}$ and $SW_{22}$. Thus, the data stored in the memory cells $M_{21}$ and $M_{22}$ corresponding to the word line $WL_2$ are possibly incorrect. Consequently, the user may read incorrect data from those memory cells, which causes great inconvenience.

SUMMARY OF THE INVENTION

The present invention provides a method for detecting if a word line of a memory array is broken. The memory array includes a plurality of word lines and a plurality of corresponding memory cells. The plurality of word lines includes a first word line and a plurality of second lines. The method comprises writing a first datum to a first memory cell corresponding to the first word line when the first word line is coupled to a first voltage source; writing a second datum different from the first datum to the first memory cell after the first word line is decoupled from the first voltage source; reading data stored in the first memory cell; and determining if the first word line is broken according to the read data stored in the first memory cell.

The present invention further provides a detecting device for detecting if a word line of a memory array is broken. The memory array includes a plurality of word lines and a plurality of corresponding memory cells. The plurality of word lines includes a first word line and a plurality of second lines. The detecting device comprises a first writing device for writing a first datum to a first memory cell corresponding to the first word line when the first word line is coupled to a first voltage source; a second writing device for writing a second datum different from the first datum to the first memory cell after the first word line is disconnected from the first voltage source; a reading device for reading data stored in the first memory cell; and a determining device for determining if the first word line is broken according to the read data stored in the first memory cell.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method for detecting broken word lines, which notifies the user if the word lines are short-circuited with other word lines. The method of the present invention not only prevents the user from using memory cells corresponding to the broken word lines, but also notifies the user to replace the bad DRAM array when the broken word lines are detected.

Figure 1:
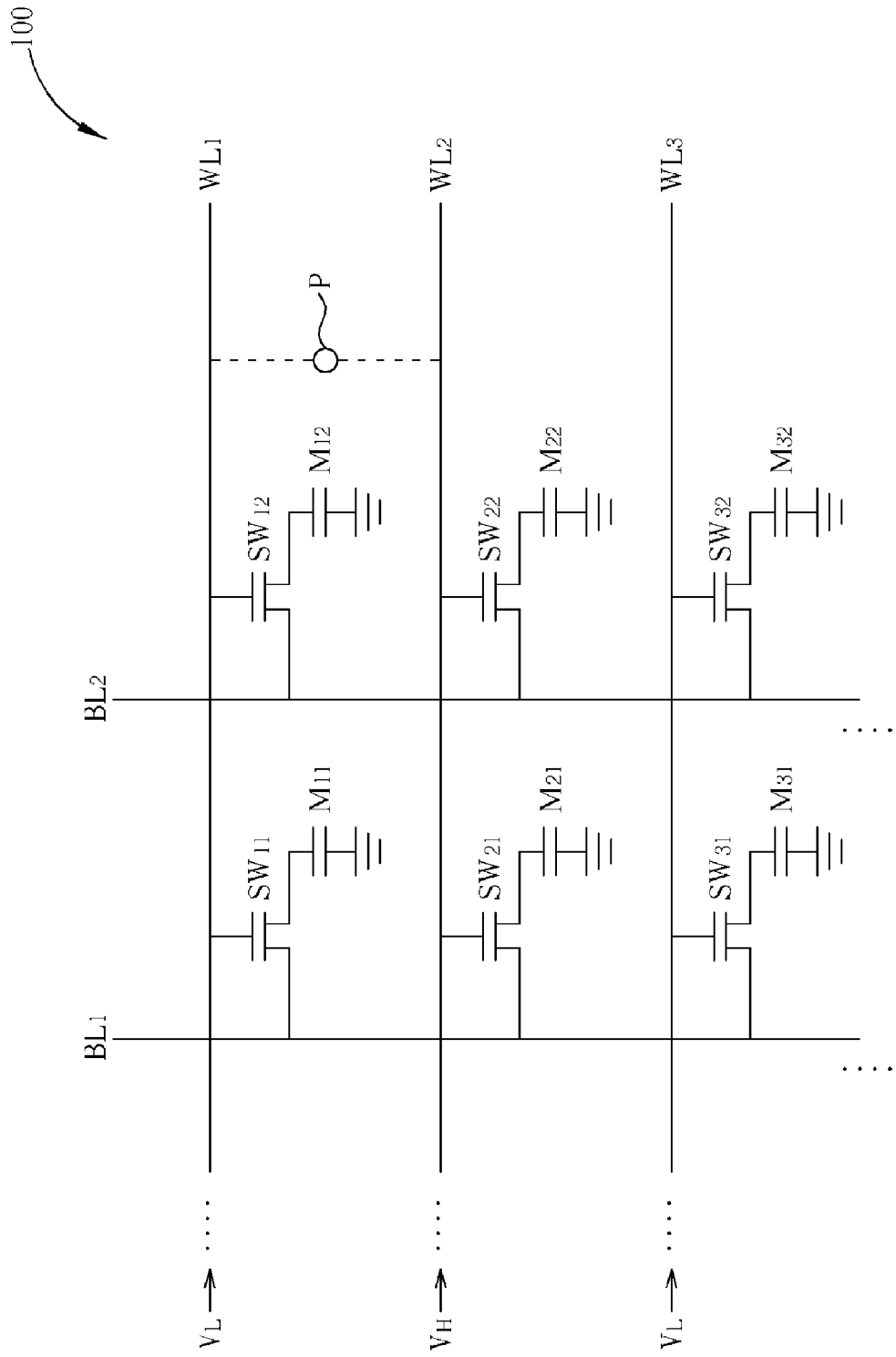
FIG. 1 is a diagram illustrating a DRAM array.
Figure 2:
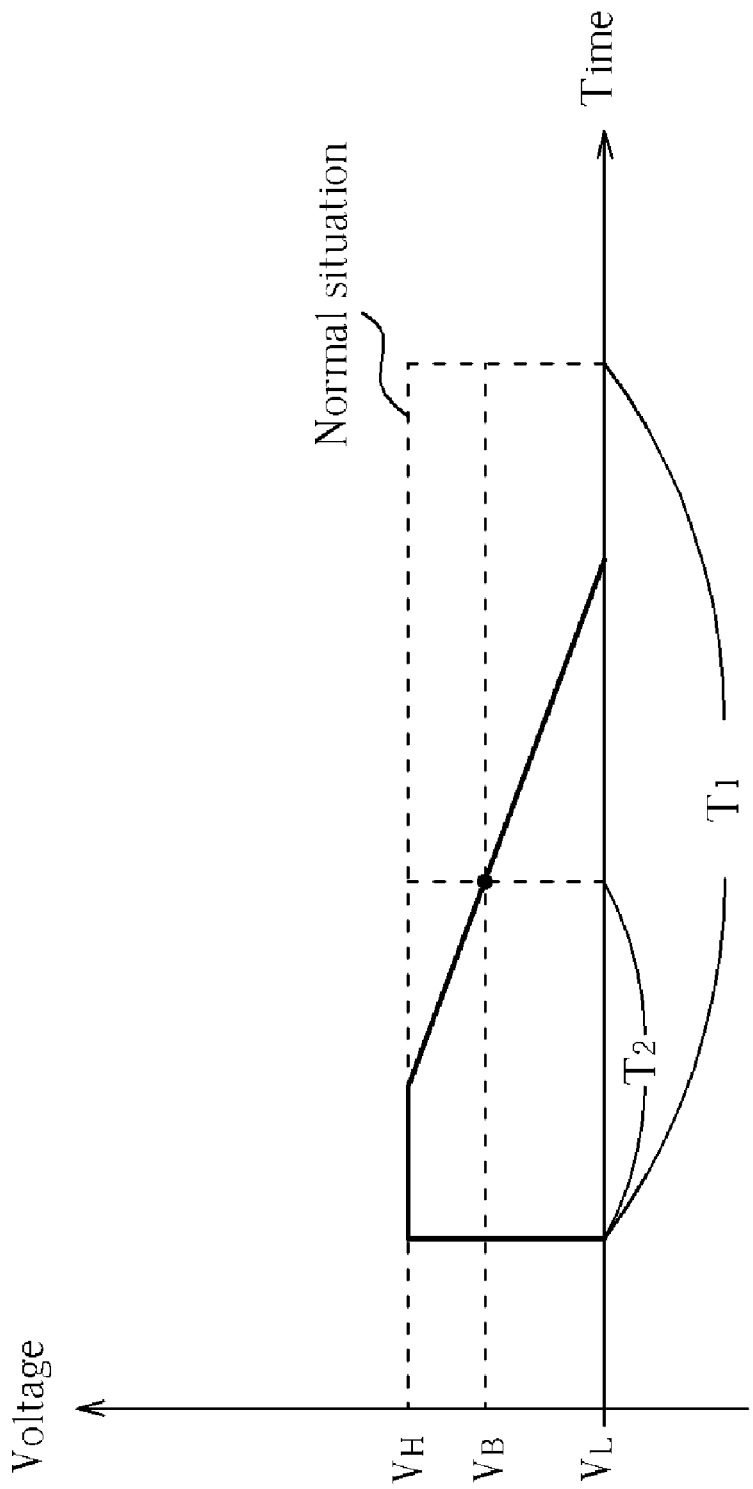
FIG. 2 is a diagram illustrating voltage on a word line.
Figure 3:
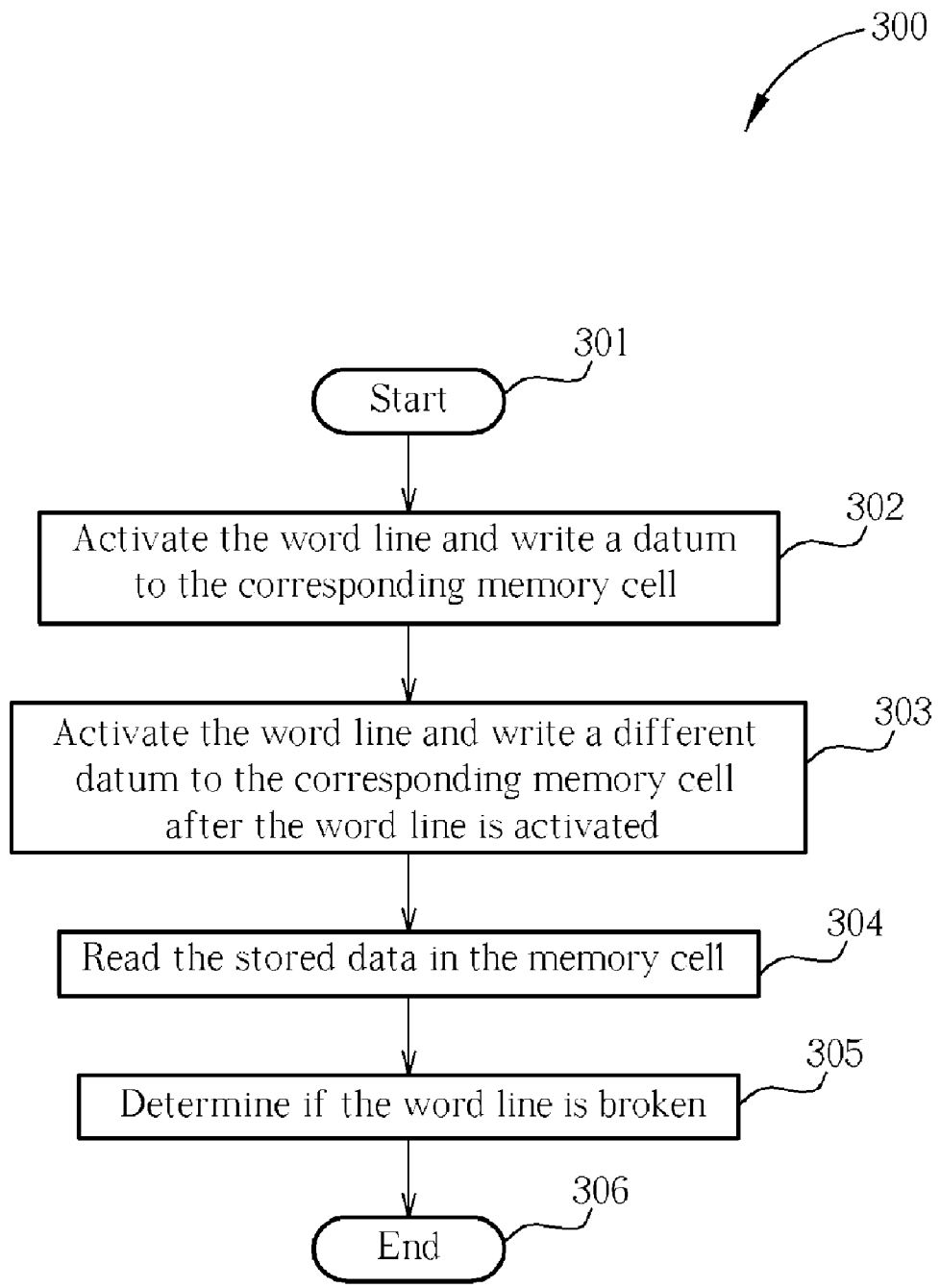
FIG. 3 is a flowchart illustrating a method of the present invention for detecting broken word lines in a DRAM array.

Please refer to FIG. 3 together with FIG. 1. FIG. 3 is a flowchart illustrating the method 300 of the present invention for detecting broken word lines in a DRAM array. The steps in FIG. 3 are executed in a DRAM array structure similar to the DRAM array structure shown in FIG. 1. More particularly, the method 300 detects if the word line $WL_2$ is broken according to the stored data in the memory cell $M_{22}$. However, the DRAM array structure in FIG. 1 is just an exemplary embodiment, and the method of the present invention can be applied to any other DRAM array structure as desired. The steps of the method 300 are described as follows:

Step 301: Start;

Step 302: Activate the word line $WL_2$, and write a datum $D_1$ to the memory cell $M_{22}$ while activating the word line $WL_2$;

Step 303: Activate the word line $WL_2$ again, and write a datum $D_2$ different from the datum $D_1$ to the memory cell $M_{22}$ after the word line $WL_2$ is activated;

Step 304: Read the stored data in the memory cell $M_{22}$;

Step 305: Determine if the word line $WL_2$ is broken according to the read data from the memory cell $M_{22}$;

Step 306: End.

In Steps 302 and 303, the data $D_1$ and $D_2$ have to be different from each other. For example, if the datum $D_1$ is "1", then the datum $D_2$ is "0", and if the datum $D_1$ is "0", then the datum $D_2$ is "1". The following description assumes the datum $D_1$ to be "1" and the datum $D_2$ to be "0".

In Step 302, the activation of the word line $WL_2$ means raising the voltage on the word line $WL_2$ to the high voltage $V_H$. The way the voltage on the word line $WL_2$ may be raised to the voltage $V_H$ can be coupling the word line $WL_2$ to a voltage source providing the voltage $V_H$. Thus, when the voltage on the word line $WL_2$ is raised to the voltage $V_H$, the switches $SW_{21}$ and $SW_{22}$ are turned on, and the datum $D_1$ "1" is loaded on the bit line $BL_2$ at the same time. In this way, the datum $D_1$ "1" is stored into the memory cell $M_{22}$.

In Step 303, activation of the word line $WL_2$ means raising the voltage on the word line $WL_2$ to the high voltage $V_H$. The way the voltage on the word line $WL_2$ may be raised to the voltage $V_H$ can be coupling the word line $WL_2$ to a voltage source providing the voltage $V_H$. Thus, when the voltage on the word line $WL_2$ is raised to the voltage $V_H$, the switches $SW_{21}$ and $SW_{22}$ are turned on. The difference between Steps 303 and 302 is that in Step 303, after the word line $WL_2$ is activated, the word line $WL_2$ is decoupled from the voltage source providing the high voltage $V_H$, and after a predetermined period $T_P$ following the decoupling, the data $D_2$ "0" is loaded on the bit line $BL_2$. In other words, in Step 303, the word line $WL_2$ is floating after the voltage on the word line $WL_2$ is raised to the high voltage $V_H$ instead of remaining at the high voltage $V_H$. Additionally, it is worth noting that the predetermined period $T_P$ has to be longer than the period $T_E$. The voltages on the word lines $WL_1$ and $WL_3$ are at the low voltage $V_L$ when the word line $WL_2$ is activated and the voltage on the activated word line $WL_2$ is at the high voltage $V_H$. If the particle P exists, after the predetermined period $T_P$, the voltage on the word line $WL_2$ falls below the threshold voltage $T_E$ so that the corresponding switches $SW_{21}$ and $SW_{22}$ are turned off. Then, when the data $D_2$ "0" is loaded on the bit line $BL_2$, the data $D_2$ "0" is not able to be written into the memory cell $M_{22}$. If the particle P does not exist, after the predetermined period $T_P$, the voltage on the word line $WL_2$ remains at the high voltage $V_H$, which is higher than the threshold voltage $T_E$, so that the corresponding switches $SW_{21}$ and $SW_{22}$ are still turned on. Then, when the data $D_2$ "0" is loaded on the bit line $BL_2$, the data $D_2$ "0" is able to be written into the memory cell $M_{22}$.

Thus, according to Steps 302 and 303, in Step 304, the reading action is executed on the memory cell $M_{22}$, and the read data from Step 304 determines if the word line $WL_2$ is broken. If the read data is "0", the writing action in Step 303 succeeded, and the word line $WL_2$ is not short-circuited with any other word line. If the read data is "1", only the writing action in Step 302 succeeded, and the writing action in Step 303 failed, and thus the word line $WL_2$ is determined to be broken and short-circuited with another word line because of the particle P. Therefore, according to the read data in Step 304, the word line $WL_2$ is determined to be broken or not in Step 305.

Additionally, the method of the present invention can be executed on multiple bit lines. For example, in Step 302, the data $D_1$ "1" is written to the memory cells $M_{21}$ and $M_{22}$ at the same time. In Step 303, the data $D_2$ "0" is written to the memory cells $M_{21}$ and $M_{22}$ at the same time. In Step 304, if the read data is "11", then it means the word line $WL_2$ is broken. In Step 304, if the read data is "00", then it means the word line $WL_2$ is not broken.

Figure 4:
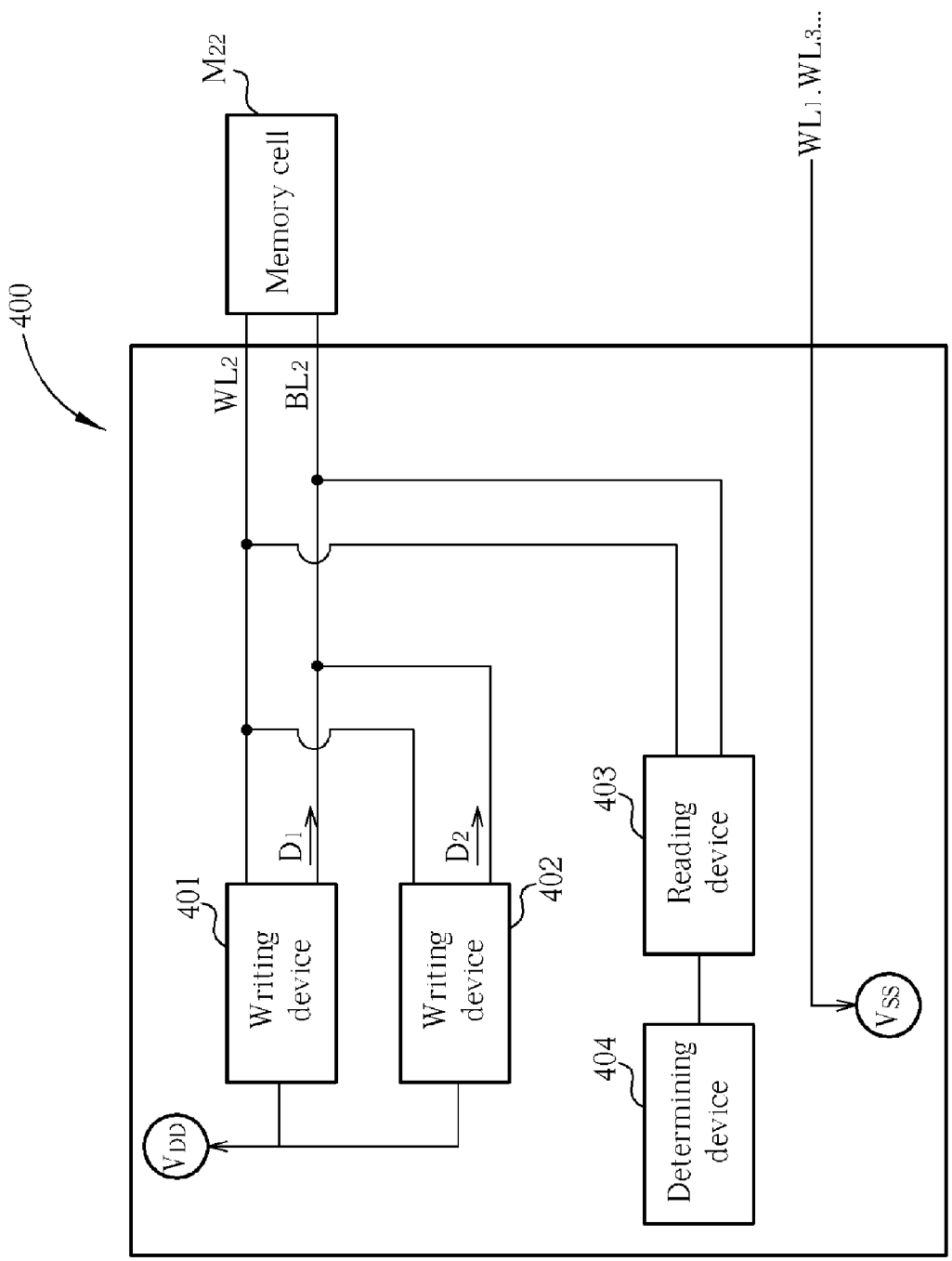
FIG. 4 is a detecting device of the present invention for detecting broken word lines in a DRAM array.

Please refer to FIG. 4. FIG. 4 is a detecting device 400 of the present invention for detecting broken word lines in a DRAM array. As shown in FIG. 4, the detecting device 400 comprises writing devices 401 and 402, a reading device 403, a determining device 404, a high voltage source $V_{DD}$ and a low voltage source $V_{SS}$. The high voltage source $V_{DD}$ provides the high voltage $V_H$, and the low voltage source $V_{SS}$ provides the low voltage $V_L$. The voltage source $V_{SS}$ is coupled to the rest of the word lines $WL_1$, $WL_3$, and so on. The writing device 401 writes data $D_1$ "1" to the memory cell $M_{22}$ when the word line $WL_2$ is coupled to the voltage source $V_{DD}$. The writing device 402 starts to write data $D_2$ "0" after the predetermined period $T_P$ following the decoupling between the word line $WL_2$ and the voltage source $V_{DD}$. The reading device reads the data stored in the memory cell $M_{22}$. The determining device 404 determines if the read data from the reading device 404 is "0" or "1", and compares with the data $D_1$ and $D_2$ for determining if the word line $WL_2$ is broken. In this way, by utilizing the detecting device 400 of the present invention, the broken word lines in a DRAM array can be detected, which provides the user more information about the DRAM used.

To sum up, the method and the device provided by the present invention can report the conditions of the word lines of the DRAM array used by the user. The method and the device of the present invention not only prevent the user from using the memory cells corresponding to those broken word lines, but also notify the user to replace the bad DRAM array when the broken word lines are detected, which increases convenience.

Those skilled in the art will readily observe that numerous modifications and alterations of the device and method may be made while retaining the teachings of the invention.

What is claimed is:

1. A method for detecting if a word line of a memory array is broken, the memory array including a plurality of word lines and a plurality of corresponding memory cells, the plurality of word lines including a first word line and a plurality of second word lines, the method comprising:

writing a first datum to a first memory cell corresponding to the first word line when the first word line is coupled to a first voltage source;

writing a second datum different from the first datum to the first memory cell after the first word line is decoupled from the first voltage source;

reading data stored in the first memory cell; and determining if the first word line is broken according to the read data stored in the first memory cell.

2. The method of claim 1, wherein determining if the first word line is broken according to the read data stored in the first memory cell is determining the first word line is broken when the read data stored in the first memory cell is the same as the first datum.

3. The method of claim 1, wherein determining if the first word line is broken according to the read data stored in the first memory cell is determining the first word line to be unbroken when the read data stored in the first memory cell is the same as the second datum.

4. The method of claim 1, wherein writing the second data different from the first datum to the first memory cell after the first word line is decoupled from the first voltage source is writing the second data different from the first datum to the first memory cell after a predetermined period after the first word line is decoupled from the first voltage source.

5. The method of claim 1, wherein writing the first datum to the first memory cell corresponding to the first word line when the first word line is coupled to the first voltage source is writing the first datum to the first memory cell corresponding to the first word line when the first word line is coupled to a high voltage source, and writing the second data different from the first datum to the first memory cell after the first word line is decoupled from the first voltage source is writing the second datum different from the first datum to the first memory cell after the first word line is decoupled from the high voltage source.

6. The method of claim 5, further comprising coupling the plurality of second word lines to a low voltage source different from the high voltage source.

7. A detecting device for detecting if a word line of a memory array is broken, the memory array including a plurality of word lines and a plurality of corresponding memory cells, the plurality of word lines including a first word line and a plurality of second word lines, the detecting device comprising:
- a first writing device for writing a first datum to a first memory cell corresponding to the first word line when the first word line is coupled to a first voltage source;
- a second writing device for writing a second datum different from the first datum to the first memory cell after the first word line is decoupled from the first voltage source;
- a reading device for reading data stored in the first memory cell; and
- a determining device for determining if the first word line is broken according to the read data stored in the first memory cell.

8. The detecting device of claim 7, wherein the determining device determines the first word line broken when the read data stored in the first memory cell is same as the first datum.

9. The detecting device of claim 7, wherein the determining device determines the first word line unbroken when the read data stored in the first memory cell is same as the second datum.

10. The detecting device of claim 7, wherein the second writing device writes the second datum to the first memory cell after a predetermined period after the first word line is decoupled from the first voltage source.

11. The detecting device of claim 7, wherein the first writing device writes the first datum to the first memory cell corresponding to the first word line when the first word line is coupled to a high voltage source, and the second writing device writes the second datum different from the first datum to the first memory cell after the first word line is decoupled from the high voltage source.

12. The detecting device of claim 11, further comprising a low voltage source different from the high voltage source for coupling the plurality of second word lines.

* * * * *